United States Patent [19]

Matsumoto et al.

[11] 4,222,121
[45] Sep. 9, 1980

[54] FREQUENCY SYNTHESIZER TYPE RECEIVER HAVING A CHANNEL SELECTION DEVICE

[75] Inventors: Takehiko Matsumoto; Hiroshi Haba, both of Sagamihara, Japan

[73] Assignee: Sanshin Electric Co., Ltd., Yokohama, Japan

[21] Appl. No.: 957,676

[22] Filed: Nov. 6, 1978

[30] Foreign Application Priority Data

Feb. 28, 1978 [JP] Japan .................................. 53/22190

[51] Int. Cl.² ............................................. H04B 1/34
[52] U.S. Cl. ................................... 455/164; 455/165; 455/168
[58] Field of Search ............... 325/315, 316, 419–421, 325/464, 470, 459; 331/17

[56] References Cited
U.S. PATENT DOCUMENTS

4,048,570  9/1977  Sumi ................................. 325/470 X

Primary Examiner—Marc E. Bookbinder
Attorney, Agent, or Firm—Bacon & Thomas

[57] ABSTRACT

A frequency synthesizer type receiver having a channel selection device which comprises a tuning sensor (40) generating a stop pulse when a radio wave from a broadcasting station is caught, a control unit (34) for controlling channel selection, and a designation signal generator (36) for supplying clock signals to the control unit (34). Upon receipt of a start pulse the designation signal generator (36) starts generating clock signals. In response to the clock signals the control unit (34) controls the frequency tuning of a frequency synthesizer receiver. When the receiver catches a radio wave from a broadcasting station, the tuning sensor (40) supplies a stop pulse to the designation signal generator (36). Upon receipt of the stop pulse the designation signal generator (36) stops generating clock signals. Then the channel selection is completed.

7 Claims, 7 Drawing Figures

FREQUENCY SYNTHESIZER TYPE RECEIVER HAVING A CHANNEL SELECTION DEVICE

BACKGROUND OF THE INVENTION

This invention relates to a radio receiver using a frequency synthesizer and having a channel selection device.

The conventional radio receiver uses switches to achieve channel selection. The switches are so frequently operated that thier contacts will soon become worn out or damaged. The switches will therefore fail to work after a long use. Thus the mechanical switches for channel selection have been the main cause of troubles to the conventional radio receivers.

SUMMARY OF THE INVENTION

An object of this invention is to provide a channel selection device for a frequency synthesizer type radio receiver, wherein only a start switch means is manually operated to start channel selection, thereby reducing the chance of trouble in a channel selection unit.

The frequency synthesizer type radio receiver according to this invention comprises a tuner circuit including a local oscillator for generating a first signal having a frequency corresponding to a tuning frequency; a programable divider for dividing the frequency of the first signal from the tuner circuit into a second signal with a predetermined frequency division ratio N; a reference signal generator for generating a third signal having a frequency based on which the tuning frequency is to be determined; a phase detector for comparing the frequencies and phases of the second and third signals respectively from the programable divider and the reference signal generator, thereby generating a fourth signal representing the frequency difference and phase difference between the second and third signals; a low pass filter for removing a ripple component of the fourth signal from the phase detector, thereby generating a fifth signal corresponding to the DC component of the fourth signal, said fifth signal controlling the tuning frequency in such a manner that the phase difference between the second and third signals becomes minimum; a control unit for supplying the programable divider with a sixth signal designating the frequency division ratio N in order to change the tuning frequency; a designation signal generator for supplying the control unit with seventh signals in order to change the sixth signal, said designation signal generator starting to generate seventh signals upon receipt of a start signal and stopping the generation of seventh signals upon receipt of a stop signal; a tuning sensor for sensing the carrier component of a radio wave from a broadcasting station caught by the tuner circuit, thereby supplying the stop signal to the designation signal generator; and a start switch means for supplying a start signal to the designation signal generator. The control unit, designation signal generator, tuning sensor and start switch means constitute a channel selection device.

When the start switch means is operated, the channel selection device automatically achieves a channel selection. If the start switch means is made sufficiently reliable, the chance of trouble in the entire channel selection device can be minimized.

DETAILED DESCRIPTION OF THE PREFERRED EMBODIMENTS

The preferred embodiments of this invention will now be described with reference to FIGS. 1 to 6, wherein like reference numerals designate like or corresponding parts throughout.

Figure 1:
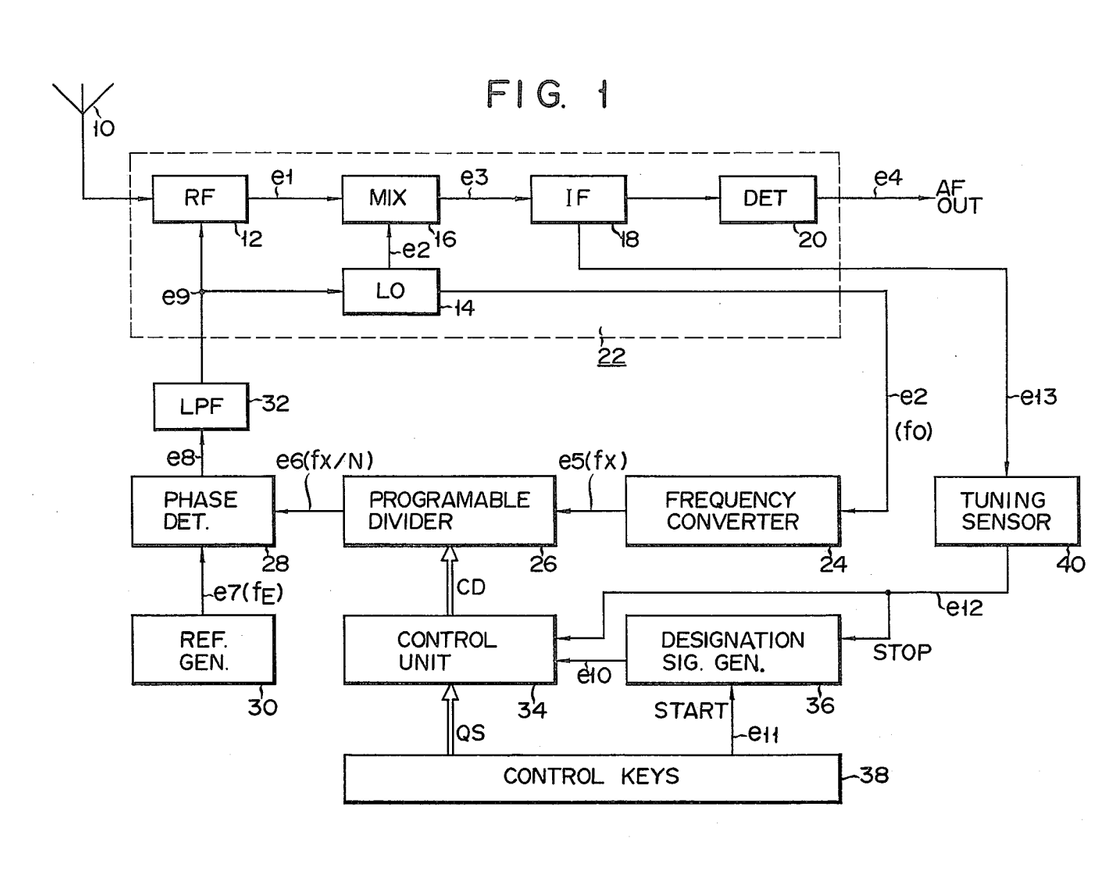
FIG. 1 is a block diagram of a frequency synthesizer type radio receiver including a channel selection device according to this invention.

FIG. 1 shows a frequency synthesizer type radio receiver including a channel selection device. An antenna 10 catches a broadcast radio wave, which is supplied to a radio frequency (RF) amplifier 12. The radio wave is tuned and amplified by the RF amplifier 12 and is thus converted into a broadcast signal e1. The signal e1 is supplied to a mixer 16 together with a local signal e2, i.e. an output of a local oscillator 14. The mixer 16 converts the broadcasting signal e1 into an intermediate frequency (IF) signal e3. The IF signal e3 has a frequency equal to the frequency difference between the broadcast signal e1 and the local signal e2. It is supplied via an intermediate frequency (IF) amplifier 18 to a detecter 20. The detector 20 demodulates an audio signal e4 which corresponds to a modulated broadcast signal e1. The audio signal e4 is supplied to an audio frequency amplifier (not shown) and a loudspeaker (not shown). The components 12 to 20 constitute a tuner circuit 22 of superheterodyne type.

The local signal e2 from the local oscillator 14 is supplied also to a frequency converter 24. The converter 24 converts the local signal e2 into a channel signal e5 which has a frequency $f_x$ corresponding to the frequency $f_o$ of the local signal e2. This signal conversion is effected by frequency division and/or frequency mixing. The channel signal e5 is supplied to a programable divider 26 which is constituted by, for example, programable counter. The divider 26 divides the frequency $f_x$ of the channel signal e5 with a predetermined ration N, thereby converting the channel signal e5 into a first frequency divided signal e6 having a frequency of $f_x/N$.

The frequency divided signal e6 is supplied to a phase detector 28, which is supplied further with a reference signal e7 having a frequency $f_E$ from a reference frequency signal generator 30. The detector 28 compares the frequency divided signal e6 with the reference signal e7 and produces a signal e8 which represents the frequency difference and/or phase difference between the signals e6 and e7. The signal e8 has its ripple component removed by a low pass filter (LPF) 32 and is therefore converted into a control signal e9. The phase difference between the signals e6 and e7 corresponds to the DC voltage level of the control signal e9. The control signal e9 is supplied to both the RF amplifier 12 and the local oscillator 14.

The RF amplifier 12 has a tuning circuit which is constituted by, for instance, a varicap or a varactor. The tuning frequency of the RF amplifier 12 is changed according to the voltage level of the control signal e9. The local oscillator 14 has an oscillation circuit which is constituted by, for example, a varicap. The oscillation frequency of the local oscillator 14 is changed according to the voltage level of the control signal e9. The local oscillator 14 is therefore a so-called "voltage controlled oscillator (VCO)". The control signal e9 has such voltage level and polarity that its voltage component eliminates the phase difference between the signals e6 and e7.

The local oscillator 14, the frequency converter 24, the programable divider 26, the phase detector 28, the reference frequency signal generator 30 and the low pass filter 32 constitute a phase locked loop (PLL). The PLL works to make the frequency $f_x/N$ of frequency divided signal e6 equal to the frequency $f_E$ of the reference signal e7. Until the frequency $f_x$ becomes equal to the frequency $f_E$, the local oscillator 14 is controlled. Namely, the tuning frequency of the tuner circuit 22 is determined by the frequency conversion characteristic of the frequency converter 24, the predetermined frequency division ratio N of the divider 26 and the output frequency $f_E$ of the reference frequency signal generator 30. Of these factors determining the tuning frequency, the frequency division ratio N is the most suitable parameter.

The components 10 to 32 constitute a typical frequency synthesizer type radio receiver. This radio receiver is provided with a channel selection device which is constituted by a control unit 34, a designation signal generator 36, a tuning sensor 40 and control keys 38.

The control unit 34 produces a channel designating signal CD, which is supplied to the programable divider 26 to determine the frequency division ratio N. The signal CD is a binary code made of bits, various combinations of which define various frequency division ratios. For example, if the signal CD is an 8-bit code, 256 ($= 2^8$) frequency division ratios are defined. The designation signal generator 36 supplies clock signals e10 to the control unit 34. Every time the control unit 34 receives a clock signal e10, the signal CD, i.e. binary code is changed, thus automatically changing the frequency division ratio N. The signal generator 36 includes a clock oscillator which starts to generate clock signals upon receipt of a start pulse e11 and stops to generate clock signals upon receipt of a stop pulse e12. The start pulse e11 is generated when one of the control keys 38 is pushed, and the stop pulse e12 is generated by a tuning sensor 40. The control keys 38 are mechanical switches. Instead, they may be photo interrupters, touch sensors or pressure-sensing semiconductor elements. The tuning sensor 40 generates a stop pulse e12 when it senses the carrier component of the broadcasting signal e1 from the tuner circuit 22, or the amplitude component of the IF signal e3.

As mentioned above, upon receipt of a start pulse e11 the designation signal generator 36 starts to supply clock signals e10 to the control unit 34. As a result, the channel designating signal CD changes to vary the frequency division ratio N of the programable divider 26. As the frequency division ratio N is varied, the tuning frequency of the tuner circuit 22 varies, too. This continues until the tuner circuit 22 catches a radio wave from a broadcasting station so that the tuning sensor 40 may generate a stop pulse.

Suppose the tuner circuit 22 catches the radio wave (frequency f1) of a station S1 when the frequency division ratio N assumes a specific value N1. Then, the tuning sensor 40 senses a signal e13 corresponding to the carrier component of the radio wave from the station S1 and supplies a stop pulse e12 to the designation signal generator 36. Upon receipt of the stop pulse e12, the signal generator 36 stops generating clock signals e10. As a result, the control unit 34 supplies the programable divider 26 with a channel designating signal CD1 which corresponds to the frequency division ratio N1. The signal CD1 is sustained until a start pulse e11 is supplied to the signal generator 36 or until a quick signal QS is supplied to the control unit 34. Thus, once the tuner circuit 22 has caught the radio wave from a broadcasting station, the radio receiver keep on receiving the wave from the station so long as a start pulse e11 or a quick channel selection signal QS is not generated.

It should be noted that clock signals e10 are generated during the channel selection. They would never be generated after the radio wave from a broadcasting station has been caught. For this reason, no reception trouble due to the higher harmonics of the clock signals e10 (e.g. beats) would occur after the automatic channel selection has been completed. The key for generating a start pulse e11 is far more frequently pushed than any other control keys 38. If this key is constituted by a reliable switch such as a micro switch, a touch sensor or a photo interrupter, the chance of trouble during the channel selection will be reduced very much.

Figure 2:
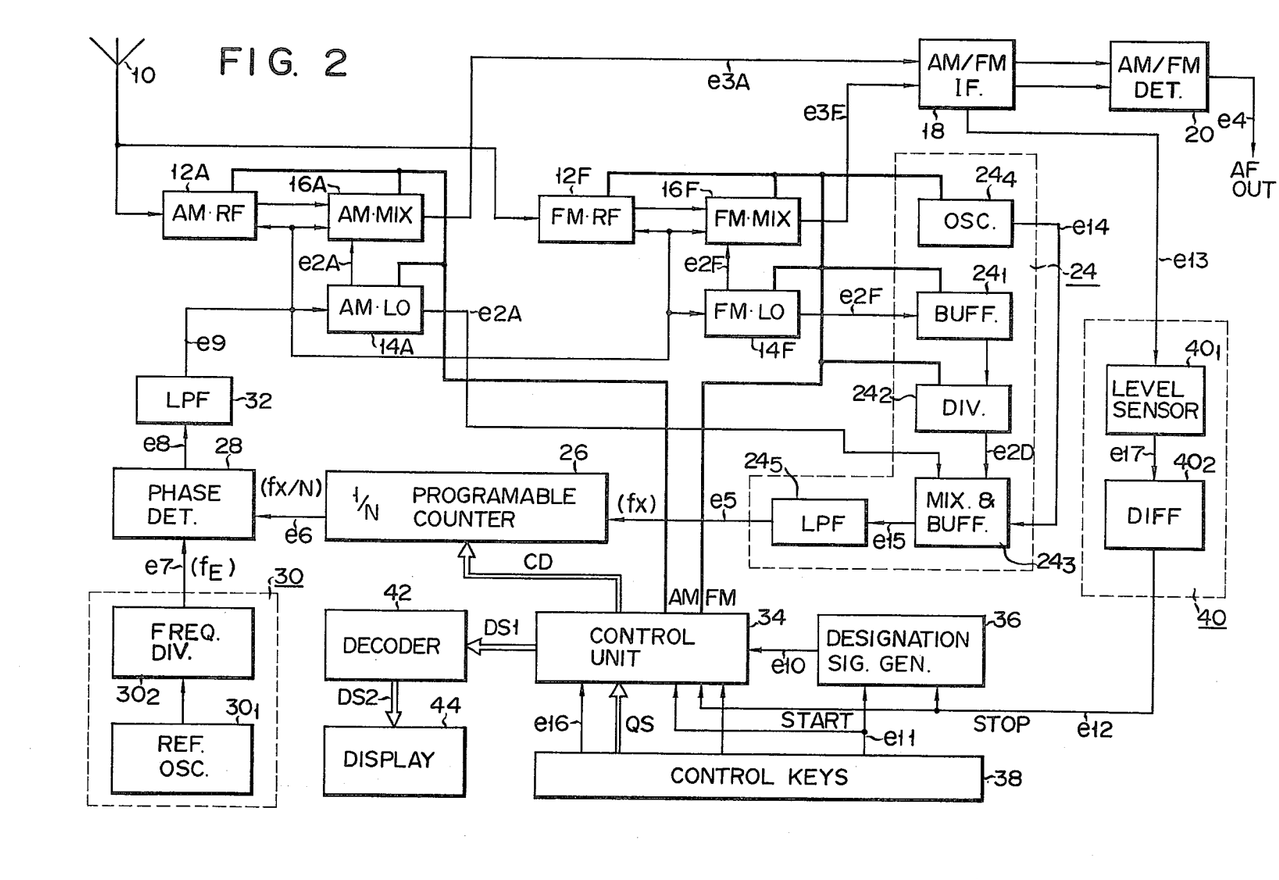
FIG. 2 is a block diagram of an FM/AM 2-band radio receiver including another type of channel selection device of this application.

FIG. 2 illustrates an FM/AM radio receiver which is similar to the radio receiver shown in FIG. 1 with respect to the basic design. This radio receiver is tuned to an FM wave or an AM wave. First it will be described how the receiver is tuned to an FM wave.

An antenna 10 catches an FM wave of, for example, 88 MHz to 108 MHz. The FM wave is supplied via a RF amplifier 12F to a mixer 16F. The mixer 16F is supplied with a local signal e2F from a local oscillator 14F, which has a frequency of, for instance, 98.7 MHz to 118.7 MHz. The mixer 16F produces an IF signal e3F of 10.7 MHz, which is supplied to an IF amplifier 18. The local signal e2F is supplied also to a frequency divider $24_2$ through a buffer $24_1$. The frequency divider $24_2$ has a frequency division ratio of, for example, 1/10. An output signal e2D of the frequency divider $24_2$, i.e. a frequency divided signal (9.87 to 11.87 MHz) is supplied to a mixer/buffer $24_3$.

The mixer/buffer $24_3$ is also supplied with an output signal e14 of an oscillator $24_4$ for achieving a frequency change. The oscillator $24_4$ has a crystal resonator of, for example, 9.37 MHz and functions stably. The frequency of the output signal e15 of the mixer/buffer $24_3$ is the difference between the frequency of the frequency divided signal e2D and that of the signal e14—that is, 0.5 MHz to 2.5 MHz. The signal e15 is supplied as a channel signal e5 to a programable counter 26 through a low pass filter (LPF) $24_5$ the cut-off frequency of which is about 2.5 MHz. The frequency range of the channel signal e5 (0.5 to 2.5 MHz) corresponds to the frequency range of the FM wave (88 to 108 MHz).

The programable counter 26 can have various frequency division ratios N and divides the frequency $f_x$ of the channel signal e5, thereby producing a frequency divided signal e6 having a frequency of $f_x/N$. The frequency divided signal e6 is supplied to a phase detector 28. The phase detector 28 is supplied also with a reference signal e7 from a reference signal generator 30. The reference signal generator 30 is constituted by a reference frequency oscillator $30_1$ having a crystal resonator of, for example, 10.24 MHz and a frequency divider $30_2$ having a frequency division ratio of $2^{10}$ (=1024). The divider $30_2$ divides an output signal of the oscillator $30_1$, thereby producing a stable signal e7 having a frequency $f_E$ of 10 KHz. The signal e6 is compared with the reference signal e7 by the phase detector 28. An output signal e8, which represents the phase difference between the signals e6 and e7, is supplied to the local oscillator 14F through a low pass filter 32.

The components 14F and 24 to 32 constitute a phase locked loop (PLL). This phase locked loop automatically makes and then maintains the frequency $f_x/N$ of the signal e6 equal to that $f_E$ of the reference signal e7. As a result, the FM/AM radio receiver is automatically tuned to a frequency determined by the frequency division ratio N of the programable counter 26. For example, if the counter 26 is set to work as a 50-scale counter (N=50), $f_x = N \cdot f_E = 50 \times 10$ KHz=0.5 MH$_2$. As mentioned above, the frequency $f_x$ of 0.5 MHz corresponds to the FM frequency of 88 MHz. Thus, the FM/AM radio receiver is tuned to 88 MHz. If the counter 26 is set to work as a 250-scale counter (N=250), $f_x=250\times 10$ KHz=2.5 MHz. Then, the frequency $f_x$ of 2.5 MHz corresponds to the FM frequency of 108 MHz, and the FM/AM radio receiver is tuned to 108 MHz. Namely, the FM band width of 20 MHz (=108 MHz−88 MHz) is divided by the count scale range of 200 (=250−50). In other words, when the frequency division ratio N is changed by 1, the tuning FM frequency is changed by 100 KHz (=20 MHz/200=10$f_E$).

The frequency division ratio N of the programable counter 26 is determined by a channel designating signal CD from a control unit 34. The signal CD is a binary code. Since the frequency division ratio N is 250 at maximum as mentioned above, it is sufficient that the signal CD is constituted by eight bits because eigth bits can define 256 count scales ($2^8$=256). The signal CD is changed as the control unit 34 receives clock signals e10 from a designation signal generator 36 or when the control unit 34 receives a quick selection signal QS from one of control keys 38.

The frequency or the channel to which the FM/AM radio receiver is tuned is displayed, using the channel designating signal CD or a signal whose binary code corresponds to the signal CD. More specifically, a first display signal DS1 which corresponds to the signal CD from the control unit 34 is supplied to a decoder 42. The decoder 42 supplies a display unit 44 with a second display signal DS2 which corresponds to the first display signal DS1.

Now will be described how the radio receiver of FIG. 2 is tuned to an AM wave. The antenna 10 catches an AM wave of, for example, 510 to 1660 KHz. The AM wave is supplied via a RF amplifier 12A to a mixer 16A. The mixer 16A is supplied with a local signal e2A from a local oscillator 14A, which has a frequency of, for instance, 970 to 2120 KHz. The mixer 16A produces an IF signal e3A of 460 KHz, which is supplied to the IF amplifier 18. The local signal e2A is supplied also to the mixer/buffer $24_3$. The local signal e2A does not have its frequency changed and is directly used as a channel signal e5. Namely, the signal e2A or channel signal e5 is supplied to the programable counter 26.

To tune the radio receiver to an AM wave, the frequency $f_x$ of the channel signal e5 has the following relationship to the frequency of the AM wave. That is, if the programable counter 26 is set to work as a 97-scale counter (N=97), $f_x=N \cdot f_E=97 \times 10$ KHz=970 KH$_2$ the frequency $f_x$ of 970 KH$_2$ corresponds to AM frequency 510 KH$_2$. If the programable counter 26 is set to work as a 212-scale counter (N=212), $f_x=212\times 10$ KHz=2120 KHz. The frequency $f_x$ of 2120 KHz corresponds to AM frequency of 1660 KHz. Namely, the AM band range of 1150 KHz (=1660 KHz−510 KHz) is divided by the count scale range of 115 (=212−97). In other words, when the frequency division ratio N changed by 1, the tuning AM frequency is changed by 10 KHz (=1150 KHz/115=$f_E$).

The easiest and most reliable way to switch between FM reception and AM reception is to select an AM power source circuit and an FM power source circuit. The AM power source circuit for the RF amplifier 12A, local oscillator 14A and mixer 16A is connected to an AM power supply terminal of the control unit 34. The FM power source circuit for the RF amplifier 12F, local oscillator 14F, mixer 16F, buffer $24_1$, frequency divider $24_2$ and oscillator $24_4$ is connected to an FM power supply terminal of the control unit 34. One of the control keys 38 is pushed to supply an FM/AM designation signal e16 to the control unit 34. In response to the signal e16, either the AM or FM power supply terminal is applied with a higher voltage. Then, the AM or FM power source circuit connected to the power supply terminal applied with a higher voltage is put into an active state.

The buffer $24_1$, frequency divider $24_2$, mixer/buffer $24_3$, oscillator $24_4$ and low pass filter $24_5$ constitute a frequency converter 24. Owing to the function of the frequency converter 24, the time constant of the low pass filter 32 need not be changed when switching between FM reception and AM reception is effected. As mentioned above, the frequency division ratio N of the programable counter 26 ranges from 97 to 212 during the AM reception. This range $N_{AM}$ of N during the AM reception falls within the range $N_{FM}$ of count scale N during the FM reception, i.e. 50 to 250. If the time constant of low pass filter 32 is set for FM reception, it need not be changed to a suitable value for AM reception.

In response to a start signal e11 from the control keys 38 the designation signal generator 36 starts to generate clock signals e10. When the radio receiver catches an FM wave or an AM wave, the IF amplifier 18 supplies a level sensor $40_1$ with an IF signal e13 which corresponds to the carrier component of the radio wave. The sensor $40_1$ generates a square wave pulse e17 when triggered by the IF signal e13. The pulse e17 is converted into a stop pulse e12 by a differential circuit $40_2$. The stop pulse e12 is supplied to the designation signal generator 36, whereby the generator 36 stops generating clock signals e10.

Figure 3:
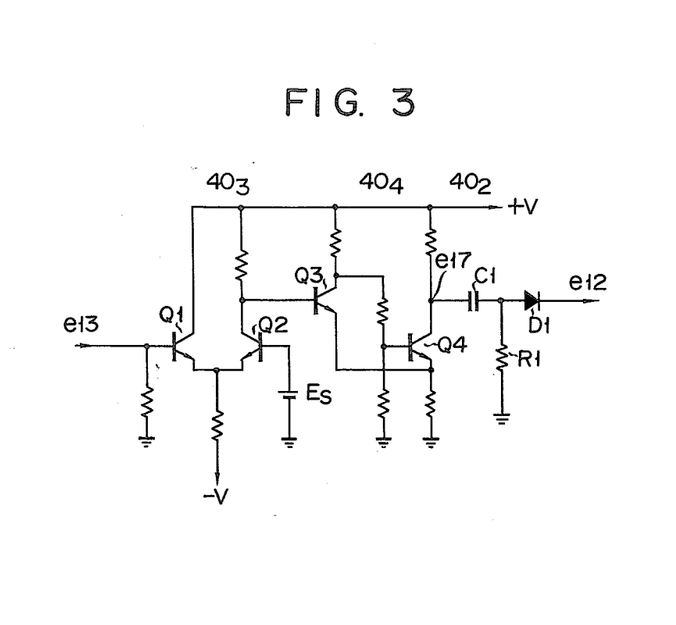
FIG. 3 is a circuit diagram of the tuning sensor used in the radio receivers shown in FIGS. 1 and 2.

The tuning sensor 40 of the channel selection devices shown in FIGS. 1 and 2 is constituted as illustrated in FIG. 3. That is, the sensor 40 comprises a differential circuit $40_2$ constituted by a capacitor C1 and a resistor R1, differential amplifier $40_3$ constituted by NPN transistors Q1 and Q2, a bistable circuit $40_4$ of emitter coupled type constituted by NPN transistor Q3 and Q4, and a diode D1 connected to the differential circuit $40_2$. The input terminal of the bistable circuit $40_4$ (a Schmidt circuit) is connected to the collector of the transistor Q2 of the differential amplifier $40_3$. The differential amplifier $40_3$ compares a reference potential Es with the potential level of the signal e13 from the IF amplifier 18. So long as the potential of the signal e13 is lower than the reference potential Es, the collectors of the transistors Q2 and Q4 remains at a low potential. When the antenna 10 catches a radio wave, the potential of the signal e13 becomes higher than the reference potential Es. Then, the collector potential of the transistor Q2 becomes high. As a result, the bistable circuit $40_4$ is triggered, and the collector potential of the transistor Q4 rises abruptly. Consequently, a signal e17 is delivered from the collector of the transistor Q4. The signal e17 is converted by the differential circuit $40_2$ into differential pulses having a narrow pulse width. Of these differential pulses, only the positive ones are taken from the diode D1 and serve as stop pulses e12. Namely, the tuning sensor 40 generates a stop pulse e12 when it receives a signal e13 having a potential higher than the reference potential Es.

To tune the radio receiver to an AM wave it is desired that a band pass filter of 460 KHz, whose selectivity Q is high, should be connected between the IF amplifier 18 and the tuning sensor 40. Assisted by such a band pass filter (not shown), the level sensor 40 responds only to the carrier component of a weak AM wave caused by a noise.

Figure 4A:
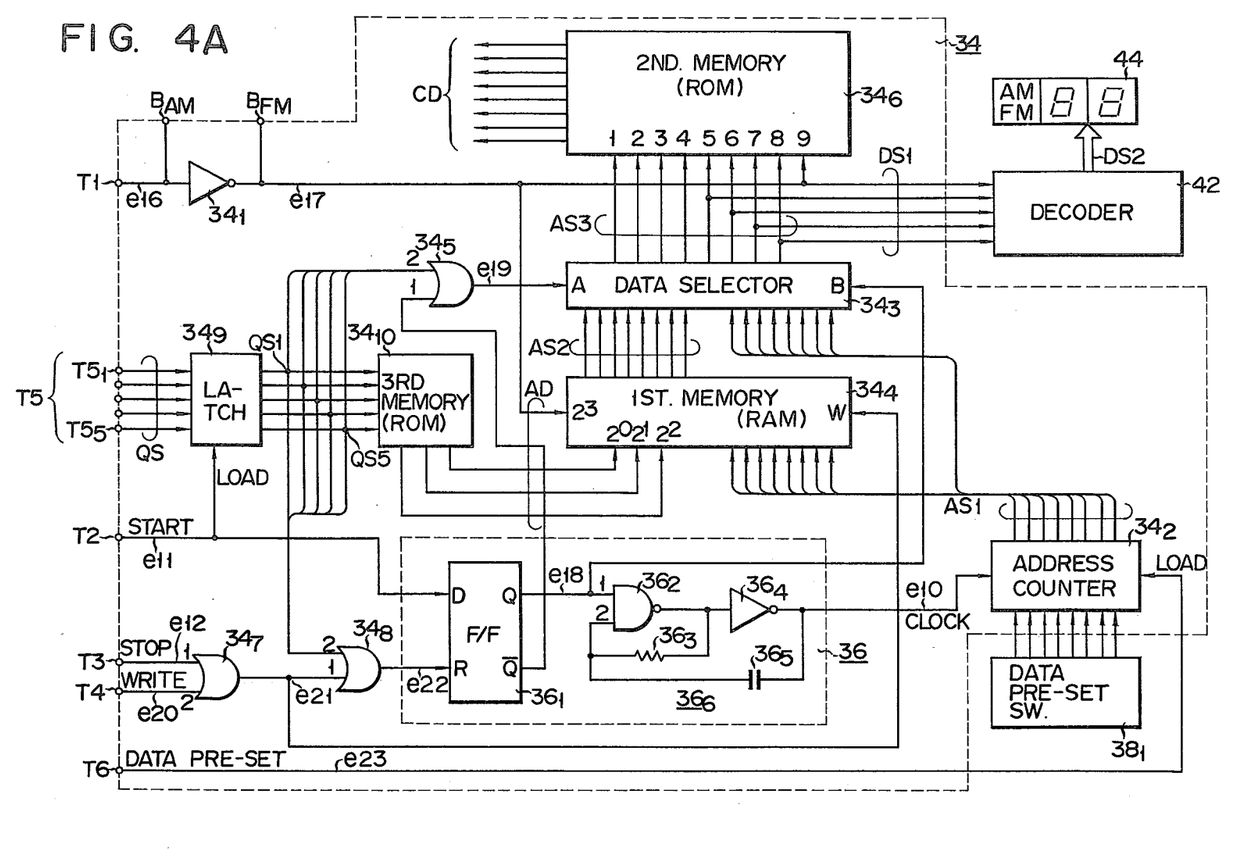
FIG. 4A is a circuit diagram of the control unit used in the radio receivers shown in FIGS. 1 and 2.

FIG. 4A shows in detail the construction of the control unit 34 and the construction of the designation signal generator 36. The control unit 34 has an inverter $34_1$ which receives an FM/AM designation signal e16 through a first terminal T1. The input and output of the inverter $34_1$ are connected to an AM power supply terminal $B_{AM}$ and an FM power supply terminal $B_{FM}$, respectively. When the signal e16 has a high level, the power is supplied through the AM power supply terminal $B_{AM}$. When signal e16 has a lower level, the power is supplied via the FM power supply terminal $B_{FM}$. The designation signal generator 36 comprises a flip-flop $36_1$ and a clock oscillator $36_6$ constituted by a NAND gate $36_2$, a resistor $36_3$, an inverter $36_4$ and a capacitor $36_5$. The first output terminal Q of the flip-flop $36_1$ is connected to the first input terminal of the NAND gate $36_2$. Between the second input terminal and output terminal of the NAND gate $36_2$ the resistor $36_3$ is connected. The output terminal of the NAND gate $36_2$ is connected to the input terminal of the inverter $36_4$. Between the output terminal of the inverter $36_4$ and the second input terminal of the NAND gate $36_2$ the capacitor $36_5$ is connected. A start pulse e11 is supplied through a second terminal T2 to the set terminal 0 of the flip-flop $36_1$. It is preferred that the flip-flop $36_1$ should be of reset dominant type.

The clock oscillator $36_6$ generates clock signals e10 while a signal e18 from the first output terminal Q of the flip-flop $36_1$ has a high level. The clock signals e10 are supplied to the clock input terminal of an address counter $34_2$ of the control unit 34. The frequency of the clock signals e10 is selected to be about 10 Hz, and the address counter $34_2$ is, for example, an 8-bit binary counter. The counter $34_2$ generates a first address signal AS1 the binary value of which corresponds to the number of clock signals e10 received. The first address signal AS1 is supplied to one input terminal of a data selector $34_3$ and the write terminal of a first memory $34_4$. The first memory $34_4$ is, for instance, an 8-bit read-write memory (RWM or RAM). Instead of memory $34_4$ may be constituted by a shift register. Upon receipt of the first address signal AS1 the first memory $34_4$ produces a readout signal or a second address signal AS2, which is supplied to the other input terminal of the data selector $34_3$.

The data selector $34_3$ selects a first address signal AS1 or a second address signal AS2 as a third address signal AS3. Which signal, signal AS1 or signal AS2 is selected depends on the level of the signal e18 supplied to an instruction input terminal B of the selector $34_3$ and the level of a signal e19 supplied to the other instruction input terminal A thereof. The signal e18 is supplied from the first output terminal Q of the flip-flop $36_1$, and the signal e19 is supplied from an OR gate $34_5$. The first input terminal of the OR gate $34_5$ is connected to the second output terminal $\overline{Q}$ of the flip-flop $36_1$. Since the signals delivered from the output terminals Q and $\overline{Q}$ have the opposite phases, the levels of the signals e18 and e19 are different. When the signal e18 is a high level one, the data selector $34_3$ selects the first address signal AS1. When the signal e19 is a high level one, the data selector $34_3$ selects the second address signal AS2.

The eight bits constituting the third address signal AS3 are supplied to the first to eighth input terminals of a second memory $34_6$, respectively. The second memory $34_6$ is constituted preferably by a read only memory (ROM). The ninth input terminal of the second memory $34_6$ receives a signal e17 from the output terminal of the inverter $34_1$. The memory $34_6$ delivers a channel designating signal CD from the address which has been designated by the third address signal AS3 and the signal e17. The address signal AS3 and the signal e17 are supplied through the decoder 42 to the display unit 44. If the display unit 44 displays 16 channels at most, it suffices to supply, as a display signal DS1 to the decoder 42, the signal e17 and only four bits of higher order in the address signal AS3. Based on the signal e17 the display unit 44 shows which radio wave the radio receiver is receiving, AM waves or FM waves. The display unit 44 may have light emitting diodes arranged on a straight line and made to correspond to the channels or radio wave frequencies, and one of the light emitting diode is lighted to indicate the corresponding channel or radio wave frequency.

If the display unit 44 is to display the radio wave frequency in four digits, all the eight bits constituting the third address signal AS3 are used. In this case the FM frequency range (88.0 MHz to 108.0 MHz) can be divided into 200 frequency bands, the difference between any adjacent two frequency bands being 0.1 MHz, and thus the display unit 44 can display 200 different FM channels.

If the third address signal AS3 is used to directly designate the frequency division ratio N of the programable counter 26 (FIG. 2), the second memory $34_6$ can be omitted. If the second memory $34_6$ is omitted, however, the structure of the decoder 42 would be extremely complicated in order to made the displayed value correspond directly to the channel or radio wave frequency which the radio receiver catches.

A stop pulse e12 is supplied through a third terminal T3 to the first input terminal of an OR gate $34_7$. A write signal e20 is supplied through a fourth terminal T4 to the second input terminal of the OR gate $34_7$. An output signal e21 of the OR gate $34_7$ is supplied to the first input terminal of an OR gate $34_8$. An output signal e22 of the OR gate $34_8$ is supplied to the reset input terminal R of the flip-flop $36_1$. Suppose that the first terminal T1 supplies a signal e16 of low level thereby to tune the radio receiver to an FM wave and that a start pulse e11 is supplied to the flip-flop $36_1$ via the second terminal T2. Then, the flip-flop $36_1$ is set. At the same time the data selector $34_3$ selects the first address signal AS1, and the clock oscillator $36_6$ starts to generate clock signals e10. Suppose the contents of the address counter $34_2$ is "1" in decimal value the moment the clock oscillator $36_6$ produces a first clock signal $e10_1$. Then an address signal $AS1_1(="1")$ is supplied to the first to eighth input terminals of the second memory $34_6$ through the data selector $34_3$. Since the radio receiver is set to receive an FM wave, the ninth input terminal of the second memory $34_6$ is receiving a signal e17 of high level "1" in binary value. The address signal $AS1_1$ and the signal e17 define a first FM address data "1+1", which designates one of the addresses of the second memory $34_6$. The designated address of the second memory $34_6$ delivers a channel designating signal CD whose decimal value is "50". The signal CD therefore makes the programable divider 26 function as a 50-scale counter. As a result, the FM/AM radio receiver is tuned to 88.0 MHz.

If no FM wave of 88.0 MHz is caught by the tuner circuit 22, no stop pulse e12 is generated. The flip-flop $36_1$ is not therefore reset. As a result, the clock oscillator $36_6$ continues to generate clock signals. When the clock oscillator $36_6$ generates, for instance, the twentieth clock signal $e10_{20}$, an FM address data "20+1" designates the corresponding address of the second memory $34_6$. The designated address delivers a channel designating signal CD whose decimal value is "70" (=50+20). The signal CD therefore causes the programable divider 26 to work as a 70-scale counter. In this case, the frequency $f_x$ of the channel signal e5 is 0.7 MHz as well understood from the description of the FM/AM radio receiver shown in FIG. 2. 0.7 MHz corresponds to a local signal of 100.7 MHz or a tuning signal of 90.0 MHz.

Suppose the radio receiver catches a radio wave of 90.0 MHz. Then, a stop pulse e12 is supplied to the third terminal T3. The output signal e21 of the OR gate $34_7$ reaches a high level, thereby resetting the flip-flop $36_1$. The clock oscillator $36_6$ therefore stops generating signals. The output signal e21 of the OR gate $34_7$ is supplied to the write terminal W of the first memory $34_4$. When the signal e21 reaches a high level, the address signal $AS1_{20}(="20")$ is written into the corresponding address of the first memory $34_4$. Of the input terminals $2^0$, $2^1$, $2^2$ and $2^3$ of the first memory $34_4$, which are to receive address designating codes AD, the input terminal $2^3$ is supplied with a signal e17 of high level, while all the other input terminals $2^0$, $2^1$ and $2^2$ are set at low level. Under this condition the address signal $AS1_{20}$ is written into, for example, the first address of the first memory $34_4$.

Since the flip-flop $36_1$ is reset, the data selector $34_3$ selects the input terminal A. The address designating code AD ($2^0$ to $2^3$) is still designating the first address of the first memory $34_4$. For this reason the address signal $AS1_{20}$ is supplied to the second memory $34_6$ through the selector $34_3$. Then the contents of the counter $34_2$ becomes unrelated with the frequency to which the radio receiver has tuned, since the address counter $34_2$ is disconnected from the second memory $34_6$. Namely, the channel designating signal CD is determined solely by the address signal $AS1_{20}$ stored in the first memory $34_4$. As a result, when the radio receiver catches a radio wave of 90.0 MHz, it automatically stays tuned to 90.0 MHz.

The channel selection is effected automatically as described above. It is possible with the control unit 34 to select a desired station quickly. Namely, quick channel selection signals QS can be supplied to the control unit 34 via a fifth terminal T5 constituted by subterminals $T5_1$ to $T5_5$. Any quick channel selection signal QS is supplied to a latch memory $34_9$. In response to a start pulse e11 supplied to the second terminal T2 the latch memory $34_9$ stores the signal QS temporarily. The latch memory $34_9$ stores the signal QS temporarily. The latch memory $34_9$ is constituted by as many flip-flops as the sub-terminals $T5_1$ to $T5_5$, thus five flip-flops. When any one of the sub-terminal $T5_1$ to $T5_5$ receives a signal QS, the corresponding flip-flop of the latch memory $34_9$ is set.

The output signals of the latch memory $34_9$, i.e. address designating signals QS1 to QS5, are supplied to the corresponding input terminals of a third memory $34_{10}$ and also to the second input terminals of the OR gates $34_5$ and $34_8$. When any one of the addresses of the third memory $34_{10}$ is designated, the flip-flop $36_1$ is reset, whereby the data selector $34_3$ selects the input terminal A. Whenever any of its addresses is designated by the address designating signals QS1, QS2, QS3, QS4 or QS5, the third memory $34_{10}$ supplies the output code corresponding to the address designating signal to the input terminals $2^0$ to $2^2$ of the first memory $34_4$. Suppose that the address designating code AD constituted by the output code of the third memory $34_{10}$ and the signal e17 cooperates to designate one of the addresses of the first memory $34_4$ and that the write signal e20 is supplied through the fourth terminal T4. Then, the contents of the counter $34_2$ are written into the designated address of the first memory $34_4$, i.e. preset data address for quick channel selection.

There are two ways to write the data for quick channel selection into the preset data address of the first memory $34_4$. One way is the aforementioned automatic channel selection, and the other is to preset in the address counter $34_2$ the predetermined address code. In the first way, if the radio receiver has caught a radio wave of 90.0 MHz and the third address of the first memory $34_4$ has been designated by the address designating signal QS1, a first address signal AS1, corresponding to 90.0 MHz is written into the third address of the first memory $34_4$ when a write signal e20 is supplied through the fourth terminal T4. If the radio receiver has caught a radio wave of 92.0 MHz and the fourth address of the first memory $34_4$ has been designated by the signal QS2, a first address signal $AS1_2$ corresponding to 92.0 MHz is written into the fourth address of the first memory $34_4$ when a write signal e20 is supplied. Similarly, if the radio receiver has caught a radio wave of 104.0 MHz and the tenth address of the first memory $34_4$ has been designated by the signal QS5, a first address signal $AS1_5$ corresponding to 104.0 MHz is written into the tenth address of the first memory $34_4$ when a write signal e20 is supplied. In the second way, a data preset switch $38_1$ included in the control keys 38 is pushed to produce a preset code corresponding to a desired radio wave frequency (or channel). The present code is set into the address counter $34_2$ when a preset signal e23 is supplied to the address counter $34_2$ through a sixth terminal T6.

The first address signal $AS1_1$, $AS1_2$, $AS1_3$, $AS1_4$ or $AS1_5$ is read out from the address of the first memory $34_4$ in the following manner. First, a quick channel selection signal QS is supplied from the control keys 38 (FIG. 2) to the sub-terminals $T5_1$, $T5_2$, $T5_3$, $T5_4$ or $T5_5$. Then, a start pulse e11 is supplied to the second terminal T2. If the signal QS is supplied to the subterminal $T5_1$ and a start pulse e11 is supplied to the second terminal T2, then the latch memory $34_9$ supplies the address designating signal QS1 to the reset terminal of the flip-flop $36_1$ through the OR gate $34_8$. As a result, the flip-flop $36_1$ is reset, and the data selection $34_3$ select the input terminal A, whereby the third memory $34_{10}$ designates the third address of the first memory $34_4$. Consequently, the third address signal AS3 supplied to the second memory $34_6$ is changed to a first address signal AS1, thereby turning the radio receiver to 90.0 MHz. Similarly, if the signal QS is supplied to the sub-terminal $T5_5$, the radio receiver is tuned to 104.0 MHz right after a start pulse e11 has been supplied through the second terminal T2.

Now will be described how the control unit 34 operates when the first terminal T1 is set at high level so that the radio receiver may be tuned to any AM radio wave.

When a start pulse e11 is supplied to the second terminal T2, the flip-flop $36_1$ is set. The data selector $34_3$ therefore selects the first address signal AS1, and the clock oscillator $36_6$ starts to generate clock signals e10. If the count of the address counter $34_2$ is "1" in decimal value the moment the clock oscillator $36_6$ produces the first clock signal e10, the first address signal $AS1_1$ (="1") is supplied to the first to eighth input terminals of the second memory $34_6$ through the selector $34_3$. The ninth input terminal of the second memory $34_6$ is set at low level "0" since the radio receiver is made to receive an AM radio wave. Thus, one of the addresses of the second memory $34_6$ is designated by the first AM address data "1+0", where "1" is a decimal code defined by the first to eighth input terminals of the second memory $34_6$ and "0" is a binary code supplied to the ninth input terminal of the second memory $34_6$. As a result, the second memory $34_6$ delivers a channel designating signal CD whose decimal value is "97", thus making the programable divider 26 function as a 97-scale counter. Consequently, the radio receiver is tuned to 510 KHz as well understood from the previous description in the present specification.

If no AM wave of 510 KHz is caught by the tuner circuit 22 the moment the radio receiver is tuned to 510 KHz, no stop pulse e12 is generated. The flip-flop $36_1$ is not therefore reset. As a result, the clock oscillator $36_6$ keeps on generating clock signals. When the clock oscillator $36_6$ generates, for example, the forty-ninth clock signal $e10_{49}$, the forty-ninth AM address data "49+0" designates the corresponding address of the second memory $34_6$. Then, the designated address delivers a channel designating signal CD whose decimal value is "146" (=97+49). The programable divider 26 is therefore made to work as a 146-scale counter. In this case, the frequency $f_x$ of the channel signal e5 is 1460 KHz. During the AM reception, the local signal e2A does not undergo any frequency change. The frequency $f_x$ is therefore equal to the frequency of the local signal e2A and corresponds to AM radio frequency of 1000 KHz.

Suppose the radio receiver catches a radio wave of 1000 KHz. Then, a stop pulse e12 is supplied to the third terminal T3. The flip-flop $36_1$ is therefore reset, and the first address signal $AS1_{49}$ (="49") is written into the corresponding address of the first memory $34_4$. Of the input terminals $2^0$, $2^1$, $2^2$ and $2^3$ of the first memory $34_4$, the terminal $2^3$ is supplied with a signal e17 of low level. If all the other input terminals $2^0$, $2^1$ and $2^2$ are set at low level, too, the first address signal $AS1_{49}$ is written into, for example, the second address of the first memory $34_4$. Since the flip-flop $36_1$ is reset, the data selector $34_3$ selects the input terminal A. The address designating code AD ($2^0$ to $2^3$) is still designating the second address of the first memory $34_4$. The channel designating signal CD is therefore determined solely by the address signal $AS1_{49}$ stored in the first memory $34_4$. As a result, when the radio receiver catches a radio wave of 1000 KHz, it automatically stays tuned to 1000 KHz.

During the AM reception the quick channel selection is controlled in the same way as during the FM reception. The preset code is set in the address counter $34_2$ also in the same way as during the FM reception. The AM channel selection control differs from the FM channel selection control only in that the level of the signal e17 is changed thereby to change the addresses of the first memory $34_4$ and second memory $34_6$, which are to be designated.

A displayed data of channel number or tuning frequency of the display unit 44 is determined only by the address data AS3 for the second memory $34_6$. Thus, the display unit 44 displays the data always in the same manner no matter whether a quick channel selection is achieved or not.

Until a desired channel is selected, the mixer 16 produces IF signals e3 at irregular intervals. Suppose the radio receiver is now tuned to 90 MHz and that the station of 96 MHz is to be selected by the above-described quick channel selection method. If there are two stations of 92 MHz and 94 MHz, the mixer 16 produces IF signals e3 two times until the station of 96 MHz is selected. These IF signals do not affect the channel selection at all because the quick channel selection is carried out in an extremely short time in the order of microseconds. The IF signals generate plural stop pulses e12. These stop pulses e12 do not affect channel selection, either because the flip-flop $36_1$ is reset during the quick channel selection.

Figure 4B:
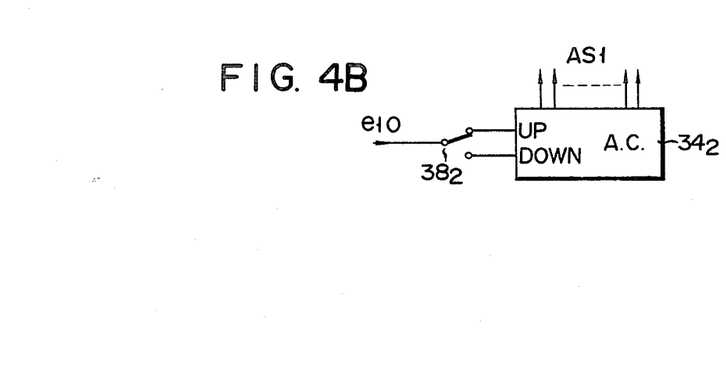
FIG. 4B shows an address counter of different type from that used in the control unit shown in FIG. 4A.

If the address counter $34_2$ is constituted by such an up-down counter as illustrated in FIG. 4B, the channel selection can be effected from the presently received radio frequency toward higher radio frequencies or toward lower radio frequencies. Suppose the radio receiver is tuned to 106 MHz and that the station of 104 MHz is to be selected. Then, if a switch $38_2$ couples the clock signals e10 to the up-count input terminal of the counter $34_2$, the channel selection goes on toward 108 MHz, then starts again from 88 MHz, and continues until the radio wave of 104 MHz is picked up by the tuner circuit 22. If the switch $38_2$ is so operated as to couple the clock signals e10 to the down-count input terminal of the counter $34_2$, the channel selection starts from 106 MHz toward lower trequency and ends shortly when the radio wave of 104 MHz is caught. To determine the count mode of the counter $34_2$, up-count mode or down-count mode, it suffices to operate the switch $38_2$ in the desired way.

Figure 5:
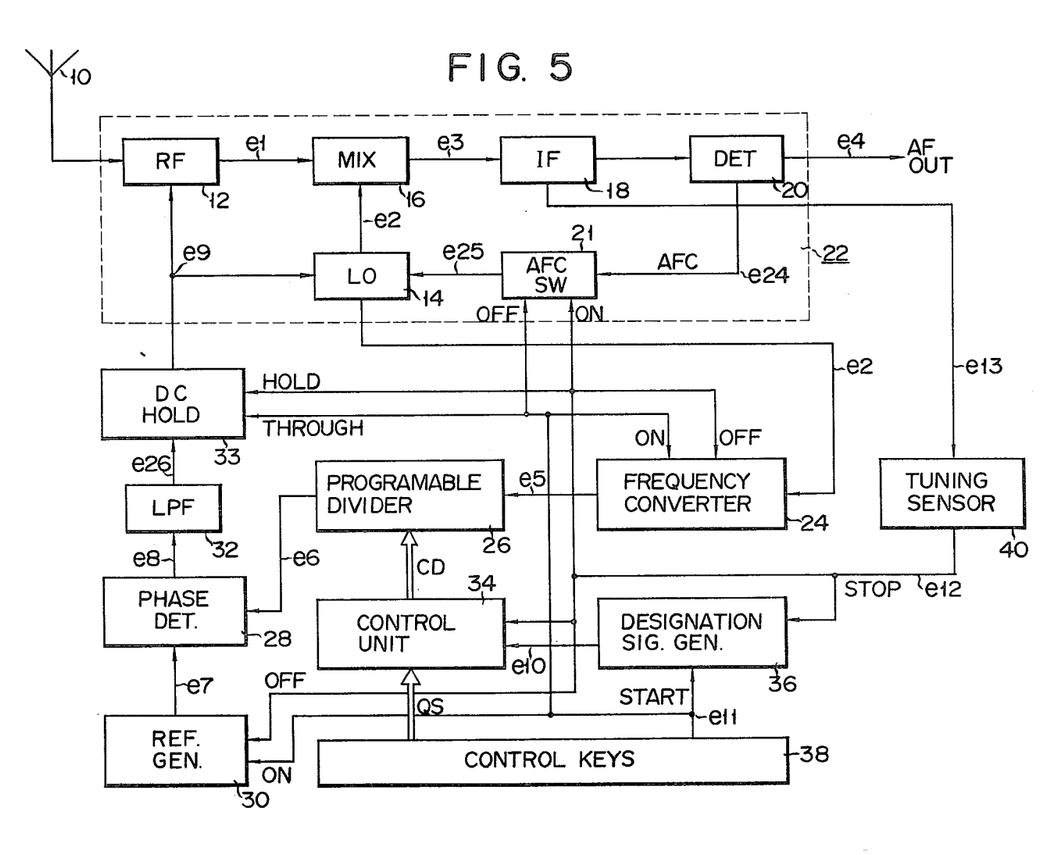
FIG. 5 is a block diagram of another embodiment of this invention type channel selection device.

FIG. 5 shows a frequency synthesizer type radio receiver different from the radio receiver illustrated in FIG. 1. The synthesizer section of this radio receiver stops upon completion of channel selection. The tuner circuit 22 is provided with an automatic frequency control (AFC) loop which is connected between a local oscillator 14 and a detector 20. Inserted in the AFC loop is an AFC switch circuit 21. The switch circuit 21 is turned off in response to a start pulse e11 and turned on in response to a stop pulse e12. The switch circuit 21 receives an AFC signal e24 from the detector 20 and supplies an AFC signal e25 to the local oscillator 14.

A DC hold circuit 33 is connected between the local oscillator 14 and a low pass filter 32 and between an RF amplifier 12 and the low pass filter 32. The hold circuit 33 applies a control signal e9 in response to a start pulse e11, converting an output signal e26 of the low pass filter 32 into the control signal e9. When supplied with a stop pulse e12, the hold circuit 33 holds the DC level of the output signal e26 of the low pass filter 32 which it has received immediately before the stop pulse e12 is supplied. Further, the pulses e11 and e12 are supplied to a frequency converter 24, a reference frequency oscillator 30 and a channel designation signal generator 36. Upon receipt of a start pulse e11 the converter 24 will produce output signal e5, the oscillator 30 will produce output signal e7, and the signal generator 36 will generate clock signals e10. Thereafter the radio receiver shown in FIG. 5 operates in the same way as the radio receiver shown in FIG. 1 until a desired channel is selected.

When a desired channel is selected and a stop pulse e12 is generated, the converter 24, the oscillator 30 and the signal generator 36 stop generating output signals. Then, the hold circuit 33 holds the DC potential corresponding to the output signal e26 of the low pass filter 32 as a control signal e9. At the same time, the AFC switch circuit 21 is turned on, thereby starting the automatic frequency control. Namely, once the desired channel has been selected, the signals e5, e7 and e10, which are unnecessary during the reception of the radio waves from the selected station, are not generated until another start pulse e11 is generated. Thus, the radio receiver shown in FIG. 5 is more advantageous than the radio receiver shown in FIG. 1 with respect to "beat" troubles during the radio wave reception.

As mentioned above, stop pulses e12 are generated at irregular intervals during the quick channel selection. It would be troublesome if such stop pulses e12 should stop the frequency converter 24 and the reference frequency oscillator 30 or should cause the hold circuit 33 to hold the DC level of the signal e26 from the low pass filter 32, before a desired channel is selected. A time lag should therefore be provided between the generation of a stop pulse e12 and the start of the control of the converter 24, oscillator 30 and circuit 33. Such a time lag can be provided by a monostable multivibrator and a differential circuit.

Figure 6:
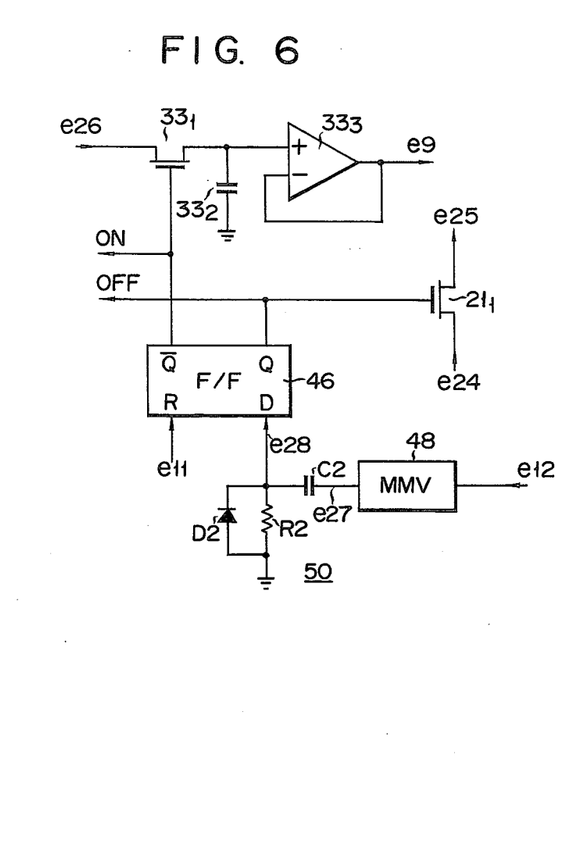
FIG. 6 is a circuit diagram of an AFC switch circuit and a DC hold circuit both used in the radio receiver shown in FIG. 5.

The AFC switch circuit 21 and the DC hold circuit 33 are constructed as illustrated in FIG. 6. A stop pulse e12 is supplied to a monostable multivibrator (MMV) 48. Triggered by the stop pulse e12, the MMV 48 produces an output pulse e27, which is converted into a differential pulse e28 by a differential circuit 50 constituted by a capacitor C2, a resistor R2 and a diode D2. The pulse e28 is always a positive pulse because of the function of the diode D2. The time lag of the pulse e28 with respect to the stop pulse e12 is selected to be a few miliseconds, for example. The MMV 48 and the differential circuit 50 constitute a delay circuit, which delays the holding operation of the hold circuit 33 and the stopping of the oscillator 30 and signal generator 36 some time after the completion of the channel selection. Namely, the reset terminal R and set terminal D of the flip-flop 46 receive a start pulse e11 and a differential pulse e28, respectively. The first ouput terminal Q and second output terminal $\overline{Q}$ of the flip-flop 46 are connected to the gates of FETs $21_1$ and $33_1$, respectively and deliver a signal to turn on or off the frequency converter 24 and the oscillator 30 respectively.

The drain of the FET $21_1$ is supplied with an AFC signal e24, and the source of the FET $21_1$ delivers an AFC signal e25. The drain of the FET $33_1$ is supplied with a signal e26, and the source of the FET $33_1$ is connected to the ground through a hold capacitor $33_2$. The source of the FET $33_1$ is connected also to the input terminal of a buffer amplifier $33_3$ having an extremely high impedance. The buffer amplifier $33_3$ is constituted by, for example, an operational amplifier of FET input type. From the output terminal of the amplifier $33_3$ a control signal e9 is provided.

Upon receipt of a start pulse e11 the flip-flop 46 is reset. The gate potential of the FET $21_1$ then becomes low, and the FET $21_1$ is turned off. At the same time the gate potential of the FET $33_1$ becomes high, and the FET $33_1$ is therefore turned on. AT this time, no automatic frequency control is carried out, and the level of the control signal e9 can be changed according to that of the signal e26. When a stop pulse e12 is generated upon completion of a channel selection, the flip-flop 46 is set with a little time lag. Then, the FET $21_1$ is turned on to start the automatic frequency control, and at the same time the FET $33_1$ is turned off. As a result, the input potential of the amplifier $33_3$ immediately before the FET $33_1$ has been turned off is held by the capacitor $33_2$. The potential thus held is applied as a control signal e9 to the RF amplifier 12 and the local oscillator 14 through the amplifier $33_3$.

The source and drain of either FET $21_1$ or $33_1$ may be connected in the opposite manner to the abovedescribed. That is, the source of the FET $21_1$ may be supplied with an AFC signal e24, and the drain thereof may deliver an AFC signal e25. Similarly, the source of the FET $33_1$ may be supplied with a signal e26, and the drain thereof may be connected to the ground through the hold capacitor $33_2$.

Although specific circuit constructions have been illustrated and described herein, it is not intended that the invention be limited to the elements and circuit arrangements discloses. One skilled in the art will recognize that other elements or subcircuits may be used without departing from the spirit of the invention.

What we claim is:

1. A frequency synthesizer type radio receiver comprising:
   a tuner circuit including a local oscillator for generating a first signal having a frequency corresponding to a tuning frequency;
   a programable divider for dividing the frequency of the first signal from said tuner circuit into a second signal with a predetermined frequency division ratio N;
   a reference signal generator for generating a third signal having a frequency based on which the tuning frequency is to be determined;
   a phase detector for comparing the frequencies and phases of the second and third signals respectively from said programable divider and said reference signal generator, thereby generating a fourth signal representing the frequency difference and phase difference between the second and third signals;
   a low pass filter for removing a ripple component from the fourth signal from the phase detector, thereby generating a fifth signal corresponding to the DC somponent of the fourth signal, said fifth signal controlling the tuning frequency so as to minimize the phase difference between the second and third signals;

a control unit for supplying said programable divider with a sixth signal designating the frequency division ratio N in order to change the tuning frequency;

a designation signal generator for supplying said control unit with seventh signals in order to change the sixth signal, said designation signal generator starting to generate seventh signals upon receipt of a start signal and stopping the generation of seventh signals upon receipt of a stop signal;

a tuning sensor for sensing the carrier component of a radio wave from a broadcasting station caught by said tuner circuit, whereby supplying the stop signal to said designation signal generator;

a start switch means for supplying the start signal to the designation signal generator; and said tuner circuit including at least two radio frequency circuits for enabling the radio receiver to receive a plurality of broadcasting bands, there being provided a frequency converter connected between said programable divider and one of the radio frequency circuits for converting the output frequency band of a radio frequency circuit into substantially the same frequency band as that of another radio frequency circuit so that the time constant of said low pass filter is constant whichever broadcasting band the radio receiver is to receive.

2. A radio receiver according to claim 1, wherein said control unit includes:

an address counter for counting the seventh signals produced by said designation signal generator, thereby producing a first address signal corresponding to the tuning frequency;

a first memory for storing the first address signal from said address counter into a specified address and delivering a second address signal from the specified address;

a data selector for selecting a first input terminal when supplied with the start signal from said start switch means and a second input terminal when supplied with a stop signal from said tuning sensor, thereby producing a third address signal, the first and second input terminals of said data selector receiving the second address signal from said first memory and the first address signal from said address counter, respectively; and a second memory storing the sixth signal designating a predetermined frequency division ratio N corresponding to a predetermined tuning frequency, said sixth signal being read out to said programable divider from the address designated by the third address signal obtained from said data selector.

3. A radio receiver according to claim 2, further including, means for supplying a write terminal of said first memory with a write signal so that the first address signal is written into a preset data address of said first memory thereby to achieve a quick channel selection, said first address signal corresponding to the predetermined tuning frequency and supplied from said address counter counting the seventh signals generated by said designation signal generator; and means for generating an address designating code designating the preset data address of said first memory, thereby reading out the second address signal from the preset data address of said first memory.

4. A radio receiver according to claim 3, wherein said first address signal corresponding to the desired tuning frequency is the counts of said address counter at the time when the stop signal stops said designation signal generator.

5. A radio receiver according to claim 3, wherein said address counter is a presettable one and said means for generating an address designating code is a preset data switch means, and the first address signal corresponding to the predetermined tuning frequency is a data preset in said address counter by said preset data switch means.

6. A radio receiver according to claim 2, wherein said address counter is an up-down counter so that channel selection is above to be effected from the presently received radio frequency toward higher radio frequencies or toward lower radio frequencies, based on the number of seventh signals which the address counter has counted.

7. A frequency synthesizer type radio receiver comprising:

a tuner circuit including a local oscillator for generating a first signal having a frequency corresponding to a tuning frequency;

a programmable divider for dividing the frequency of of the first signal from said tuner circuit into a second signal with a predetermined frequency division ratio N;

a reference signal generator for generating a third signal having a frequency based on which the tuning frequency is to be determined;

a phase detector for comparing the frequencies and phases of the second and third signals respectively from said programmable divider and said reference signal generator, thereby generating a fourth signal representing the frequency difference and phase difference between the second and third signals;

a low pass filter for removing a ripple component from the fourth signal from the phase detector, thereby generating a fifth signal corresponding to the DC component of the fourth signal, said fifth signal controlling the tuning frequency so as to minimize the phase difference between the second and third signals;

a control unit for supplying said programmable divider with a sixth signal designating the frequency division ratio N in order the chance the tuning frequency;

a designation signal generator for supplying said control unit with seventh signals in order to change the sixth signal, said designation signal generator starting to generate seventh signals upon receipt of a start signal and stopping the generation of seventh signals upon receipt of a stop signal;

a tuning sensor for sensing the carrier component of a radio wave from a broadcasting station caught by said tuner circuit, thereby supplying the stop signal to said designation signal generator;

a start switch means for supplying the start signal to the designation signal generator;

said tuner circuit including an automatic frequency control loop for stabilizing the tuning frequency, said automatic frequency control loop being provided with a switching circuit which is turned off by the start signal and turned on by the stop signal;

said reference signal generator starting to generate a third signal upon receipt of the start signal and stopping generation of the third signal upon receipt of the stop signal, thereby avoiding beat troubles in said tuner circuit after said tuner circuit has caugth the desired broadcasting station; and a DC hold circuit connected between said low pass filter and the local oscillator of said tuner circuit for holding the radio frequency of the desired broadcasting station even if said reference signal generator no longer generates the third signal, said DC hold circuit delivering its input signal as the fifth signal in response to the start signal and holding, in response to the stop signal, the DC voltage component of its input signal until another start signal is supplied.

* * * * *